(12) United States Patent
Yasuda

(10) Patent No.: US 9,612,434 B2
(45) Date of Patent: Apr. 4, 2017

(54) PIEZOELECTRIC DEVICE INCLUDING CONDUCTIVE LAYER, ITS MANUFACTURING METHOD AND OPTICAL DEFLECTOR

(71) Applicant: STANLEY ELECTRIC CO., LTD., Meguro-ko, Tokyo (JP)

(72) Inventor: Yoshiaki Yasuda, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/141,646

(22) Filed: Apr. 28, 2016

(65) Prior Publication Data

US 2016/0341956 A1 Nov. 24, 2016

(30) Foreign Application Priority Data

May 20, 2015 (JP) .................. 2015-103049

(51) Int. Cl.
| | |
|---|---|
| *G02B 26/08* | (2006.01) |
| *H01L 41/08* | (2006.01) |
| *H01L 41/316* | (2013.01) |
| *G02B 26/10* | (2006.01) |
| *H01L 41/047* | (2006.01) |

(Continued)

(52) U.S. Cl.
CPC ....... *G02B 26/0858* (2013.01); *G02B 26/105* (2013.01); *H01L 41/0471* (2013.01); *H01L 41/083* (2013.01); *H01L 41/0805* (2013.01); *H01L 41/09* (2013.01); *H01L 41/1876* (2013.01); *H01L 41/297* (2013.01); *H01L 41/316* (2013.01); *H01L 41/0953* (2013.01)

(58) Field of Classification Search
CPC ............. H01L 41/0471; H01L 41/0477; H01L 41/0478; H01L 41/047; H01L 41/332; H01L 41/314; H01L 28/56; H01L 41/09; H01L 41/00; H01L 41/1876; H01L 41/0805; H01L 41/083; H01L 41/297; H01L 21/31691; B81B 3/0018; B41J 2/1646; B41J 2/14201; Y10T 29/42
USPC ........................................... 359/198.1–224.1
See application file for complete search history.

(56) References Cited

U.S. PATENT DOCUMENTS

| | | | |
|---|---|---|---|
| 2013/0099121 A1 | 4/2013 | Kawano et al. | |
| 2013/0140156 A1* | 6/2013 | Fujii | H01L 41/0838 310/363 |

(Continued)

FOREIGN PATENT DOCUMENTS

JP 2007116006 A 5/2007

OTHER PUBLICATIONS

Extended European Search Report (EESR) dated Oct. 12, 2016, issued in counterpart European Application No. 16169154.8.

(Continued)

*Primary Examiner* — Euncha Cherry
(74) *Attorney, Agent, or Firm* — Holtz, Holtz & Volek PC

(57) ABSTRACT

A piezoelectric device includes a substrate; an insulating layer provided on the substrate; a lower electrode layer provided on the insulating layer; a piezoelectric structure provided on the lower electrode layer, the piezoelectric structure including at least one conductive layer and multiple piezoelectric layers sandwiching the conductive layer, the conductive layer having the same crystal structure as that of the piezoelectric layers; and an upper electrode layer provided on the piezoelectric structure.

13 Claims, 14 Drawing Sheets

(51) Int. Cl.
    *H01L 41/083*     (2006.01)
    *H01L 41/187*     (2006.01)
    *H01L 41/297*     (2013.01)
    *H01L 41/09*     (2006.01)

(56) References Cited

U.S. PATENT DOCUMENTS

2014/0355088 A1   12/2014   Yasuda et al.
2015/0054387 A1    2/2015   Li

OTHER PUBLICATIONS

Iijima, et al., "Texture-Control of Lead Zirconate Titanate Films for Actuator Applications", Transducing Materials and Devices, Proceedings of SPIE, vol. 4946, 2003, pp. 98-110.
Li, et al., "Piezoelectric AlGaAs bimorph microactuators", Journal of Micromechanics & Microengineering, vol. 16, No. 5, Apr. 19, 2006, pp. 1062-1066.

\* cited by examiner

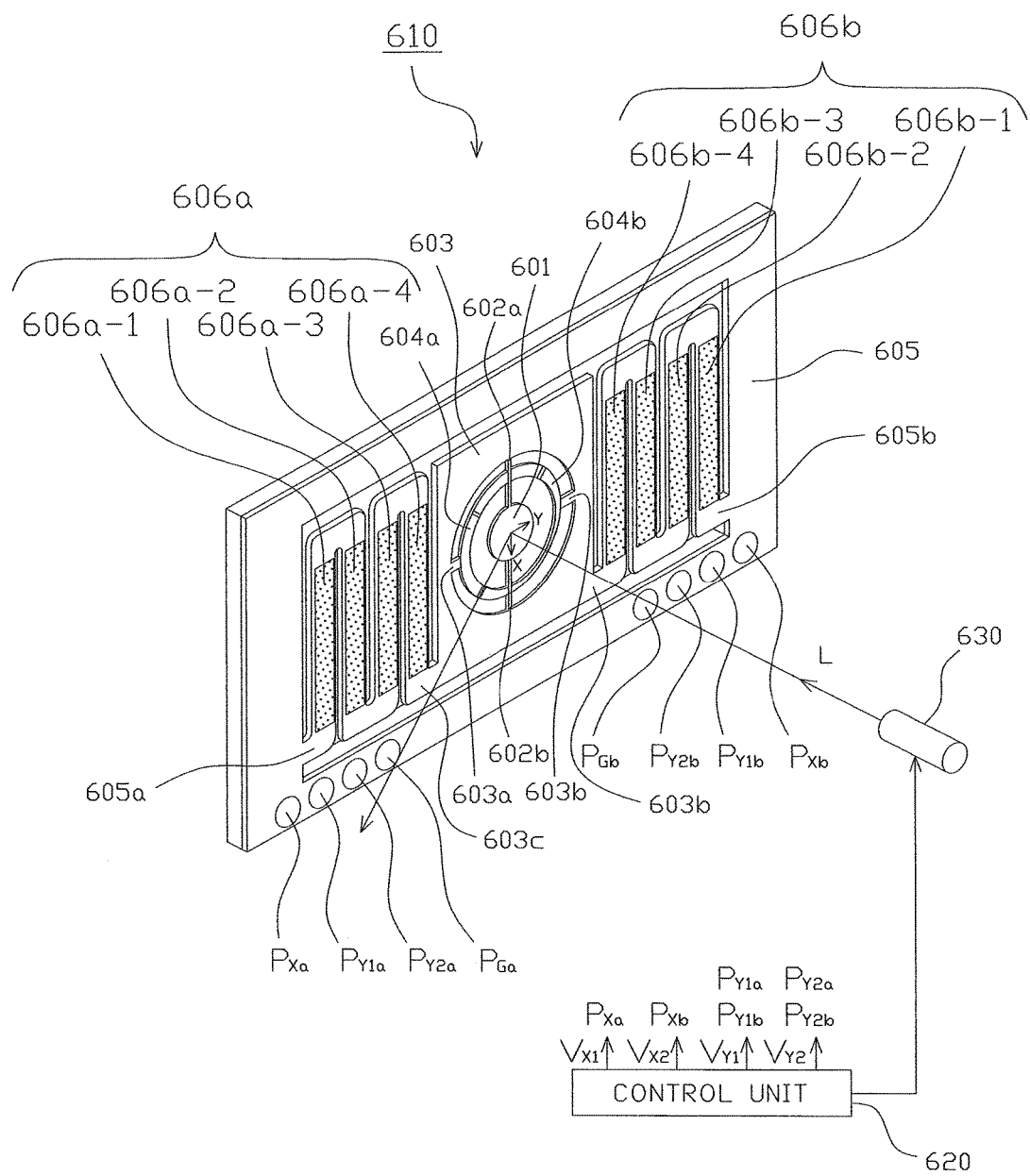

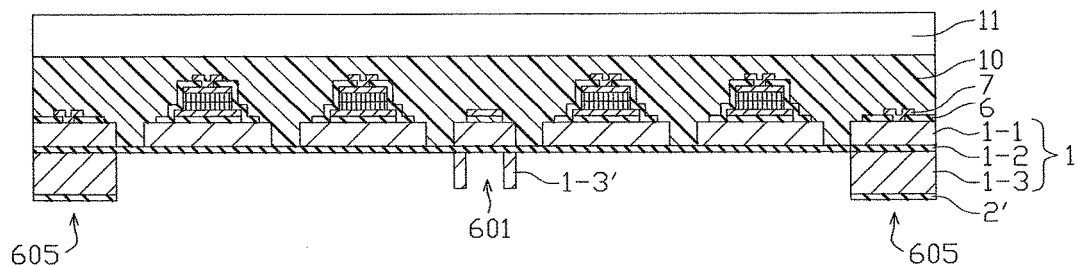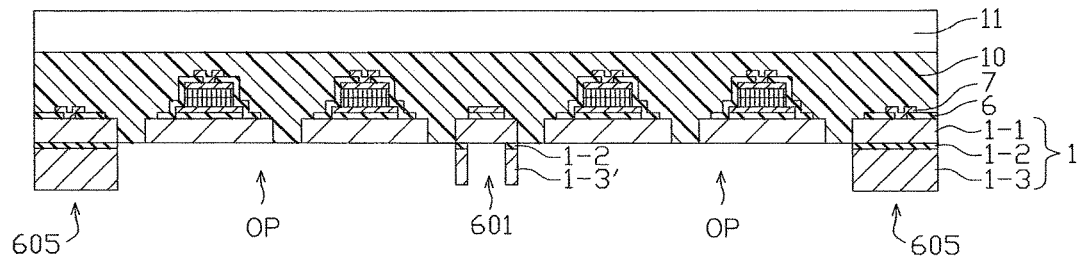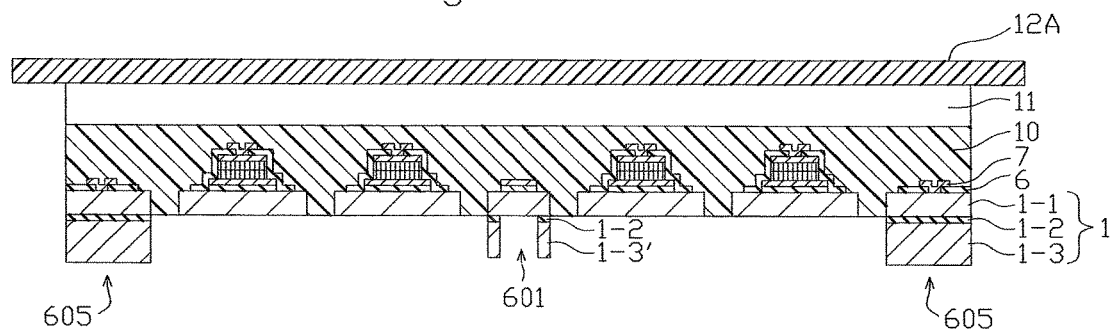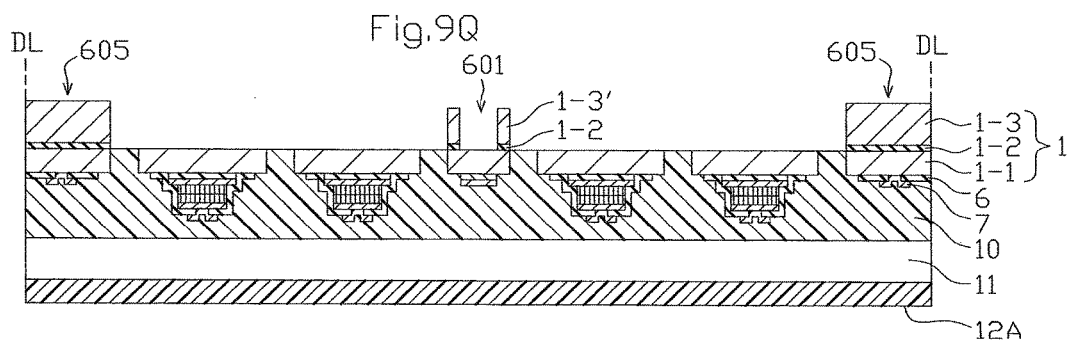

PIEZOELECTRIC DEVICE INCLUDING CONDUCTIVE LAYER, ITS MANUFACTURING METHOD AND OPTICAL DEFLECTOR

This application claims the priority benefit under 35 U.S.C. §119 to Japanese Patent Application No. JP2015-103049 filed on May 20, 2015, which disclosure is hereby incorporated in its entirety by reference.

BACKGROUND

Field

The presently disclosed subject matter relates to a piezoelectric device, its manufacturing method and an optical deflector using the piezoelectric device.

Description of the Related Art

Recently, piezoelectric devices such as piezoelectric actuators and piezoelectric sensors used in optical scanners have been micro electro mechanical system (MEMS) devices manufactured by semiconductor manufacturing technology and micro machine technology.

In the above-described MEMS device, a piezoelectric layer is formed on a silicon substrate (wafer) by a dry deposition process such as a sputtering process, an ion plating process, a metal organic chemical vapor deposition (MOCVD) process, a pulse laser deposition (PLD) process and a molecular beam epitaxial (MBE) process, or a wet deposition process such as a chemical solution deposition (CSD) process.

In FIG. 1, which is a cross-sectional view for explaining a first prior art method for manufacturing a piezoelectric device by a dry deposition process, one piezoelectric layer such as one lead zirconate titanate $PbZr_xTi_{1-x}O_3$ (PZT) layer 104 is continuously grown on a silicon substrate 101, to realize a columnar crystalline structure of PZT whose piezoelectric constant $(-d_{31})$ becomes large. Therefore, even if the PZT layer 104 is much thicker, the PZT layer 104 would not be peeled off from the substrate 101.

In FIG. 1, note that reference numeral 102 designates an insulating layer, 103 designates a lower electrode layer, and 105 designates an upper electrode layer.

In the columnar crystalline structure, however, Pb components are diffused and segregated into grain boundaries 104a thereof indicated by X, so that electric properties along the thickness direction would deteriorate. Particularly, if segregated Pb components are combined with each other to generate leakage current paths, leakage currents would flow through the segregated Pb components so that the reliability would deteriorate.

Also, the thickness of the PZT layer 104 has recently been increased from about 1 to 2 µm to about 4 to 5 µm to increase the output power of the piezoelectric device. In this case, the roughness at a top surface of the PZT layer 104 would be increased, so that the peak-to-valley (PV) value of the top surface is about 200 nm. Therefore, electric fields would be concentrated on the rough surface of the PZT layer 104 to dielectrically break it down. Further, when the piezoelectric device is driven to grow cracks in the PZT layer 104, water in the air would be immersed into the cracks, which also would increase the leakage currents through the segregated Pb components of the PZT layer 104.

The larger the columnar structure of the PZT layer 104, the larger the roughness of the top surface of the PZT layer 104. Also, the larger the roughness of the top surface of the PZT layer 104, the worse the piezoelectric property of the PZT layer 104.

In order to reduce the leakage currents and the roughness of the top surface of the PZT layer, in a second prior art method for manufacturing a piezoelectric device by a dry deposition process, multiple PZT growing operations, where the substrate temperature is higher than the Curie temperature of PZT, are carried out, and one no-PZT-growing operation, where the substrate temperature is lower than the Curie temperature of PZT, is carried out between the PZT growing operations (see: JP2007-116006). In the no-PZT-growing operation, atoms in the grown PZT layers would be rearranged and oxygen would be introduced into oxygen deficient portions of the grown PZT layers, thus realizing a columnar crystalline PZT whose thickness is relatively large. For example, a total time period for the multiple PZT growing operations is about 4 hours, while a total time period for the no-PZT-growing operation is about 1 hour.

In the above-described second prior art method, however, since the time period for the no-PZT-growing operation is large, the throughput of piezoelectric devices is low. Also, since Pb components would be evaporated from the grown PZT layers during the no-PZT-growing operation, the piezoelectric property would deteriorate.

In a third prior art method for manufacturing a piezoelectric device by a dry deposition process, a relatively-low dielectric piezoelectric layer made of $PbTiO_3$ (PT) or the like is provided between the PZT layer and its adjacent electrode layers, thus preventing Pb components of PZT from being diffused into the electrode layers. Therefore, leakage currents therethrough can be reduced.

In the above-described third prior art method, however, since the intensity of an internal electric field of the PZT layer is decreased, the displacement amount of the piezoelectric device would be decreased.

On the other hand, in a prior art method for manufacturing a piezoelectric device by a wet deposition process such as a CSD process, multiple processes each including one spin-coating operation, one drying operation and one calcining operation are carried out, so that leakage current paths in the thickness direction can be reduced and the breakdown voltage can be increased.

In the above-described method by a wet deposition process, however, the piezoelectric property generally would not be so high as compared with that of the dry process.

SUMMARY

The presently disclosed subject matter seeks to solve one or more of the above-described problems.

According to the presently disclosed subject matter, a piezoelectric device includes a substrate; an insulating layer provided on the substrate; a lower electrode layer provided on the insulating layer; a piezoelectric structure provided on the lower electrode layer, the piezoelectric structure including at least one conductive layer and multiple piezoelectric layers sandwiching the conductive layer, the conductive layer having the same crystal structure as that of the piezoelectric layers; and an upper electrode layer provided on the piezoelectric structure.

Also, according to the presently disclosed subject matter, an optical deflector includes a mirror; a first frame surrounding the mirror; a first piezoelectric actuator formed by the above-mentioned piezoelectric device, coupled between the mirror and the first frame and adapted to rock the mirror around a first axis.

Further, according to the presently disclosed subject matter, a method for manufacturing a piezoelectric device includes forming an insulating layer provided on a substrate;

forming a lower electrode layer on the insulating layer;
forming a piezoelectric structure provided on the lower
electrode layer, the piezoelectric structure including at least
one conductive layer and multiple piezoelectric layers sandwiching the conductive layer, the conductive layer having
the same crystal structure as that of the piezoelectric layers;
and forming an upper electrode layer formed on the piezoelectric structure.

Thus, according to the presently disclosed subject matter,
in the piezoelectric structure, since the continuity of the
piezoelectric layers is interrupted by the conductive layer,
leakage currents would not flow through the piezoelectric
structure. Also, since each of the piezoelectric layers can be
thin, the roughness of a top surface of the piezoelectric
structure can be decreased, so that the piezoelectric property
can be improved.

BRIEF DESCRIPTION OF THE DRAWINGS

The above and other advantages and features of the
presently disclosed subject matter will be more apparent
from the following description of certain embodiments,
taken in conjunction with the accompanying drawings, as
compared with the prior art, wherein:

FIG. 6 is a perspective view illustrating a two-dimensional optical deflector to which the piezoelectric device of
FIG. 2 is applied;

DETAILED DESCRIPTION OF EXEMPLARY
EMBODIMENTS

Figure 2:
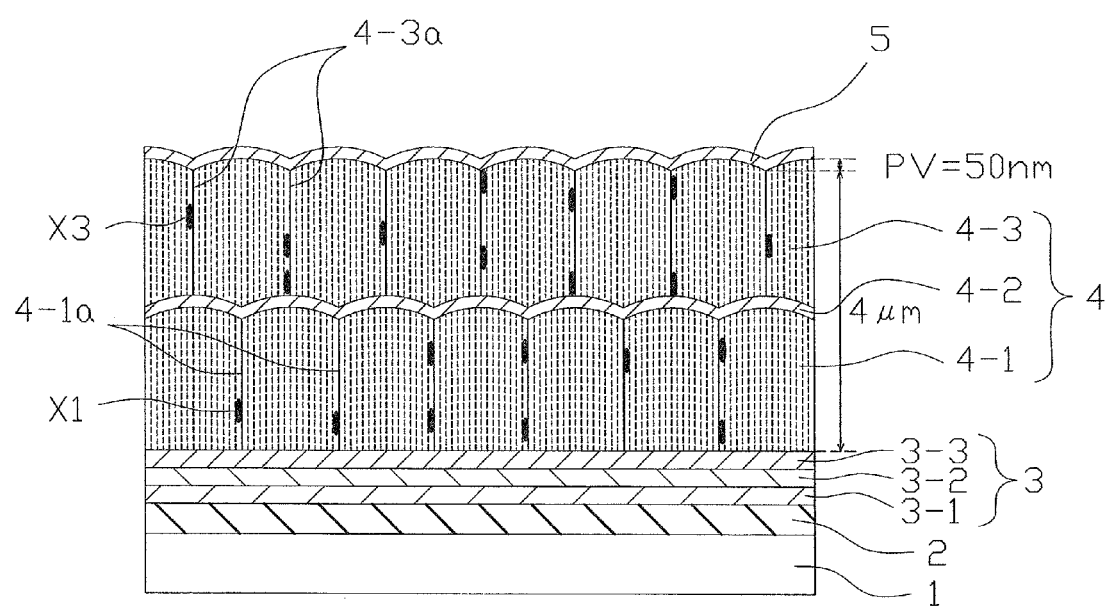
FIG. 2 is a cross-sectional view illustrating an embodiment of the piezoelectric device according to the presently
disclosed subject matter.

In FIG. 2, which illustrates an embodiment of the piezoelectric device according to the presently disclosed subject
matter, reference numeral 1 designates a monocrystalline
silicon substrate (wafer) which may be derived from a
monocrystalline silicon active layer of a silicon-on-insulator
(SOI) substrate (wafer). Also, provided on the silicon substrate 1 is an about 500 nm thick insulating layer 2 made of
thermally grown silicon dioxide. Further, provided on the
insulating layer 2 is a. Ti/Pt/SRO lower electrode layer 3
which includes an about 50 nm thick Ti layer 3-1, an about
150 nm thick Pt layer 3-2 on the Ti layer 3-1 and an about
100 nm thick strontium ruthenium, oxide (SRO) layer 3-3.

Further, provided on the lower electrode layer 3 is a piezoelectric structure 4 which includes an about 2 μm thick PZT
layer 4-1, an about 50 nm thick SRO layer 4-2 on the PZT
layer 4-1 and an about 2 μm thick PZT layer 4-3 on the SRO
layer 4-2. Further, provided on the piezoelectric structure 4
is an about 150 nm thick Pt upper electrode layer 5.

Note that the thickness of the SRO layer 4-2 can be from
100 nm to 20 nm, preferably, about 50 nm. If the thickness
of the SRO layer 4-2 is larger than 100 nm, the quality of the
PZT layer 4-3 on the SRO layer 4-2 would deteriorate. If the
thickness of the SRO layer 4-2 is smaller than 20 nm, the
coverage characteristics would deteriorate.

Figure 3:
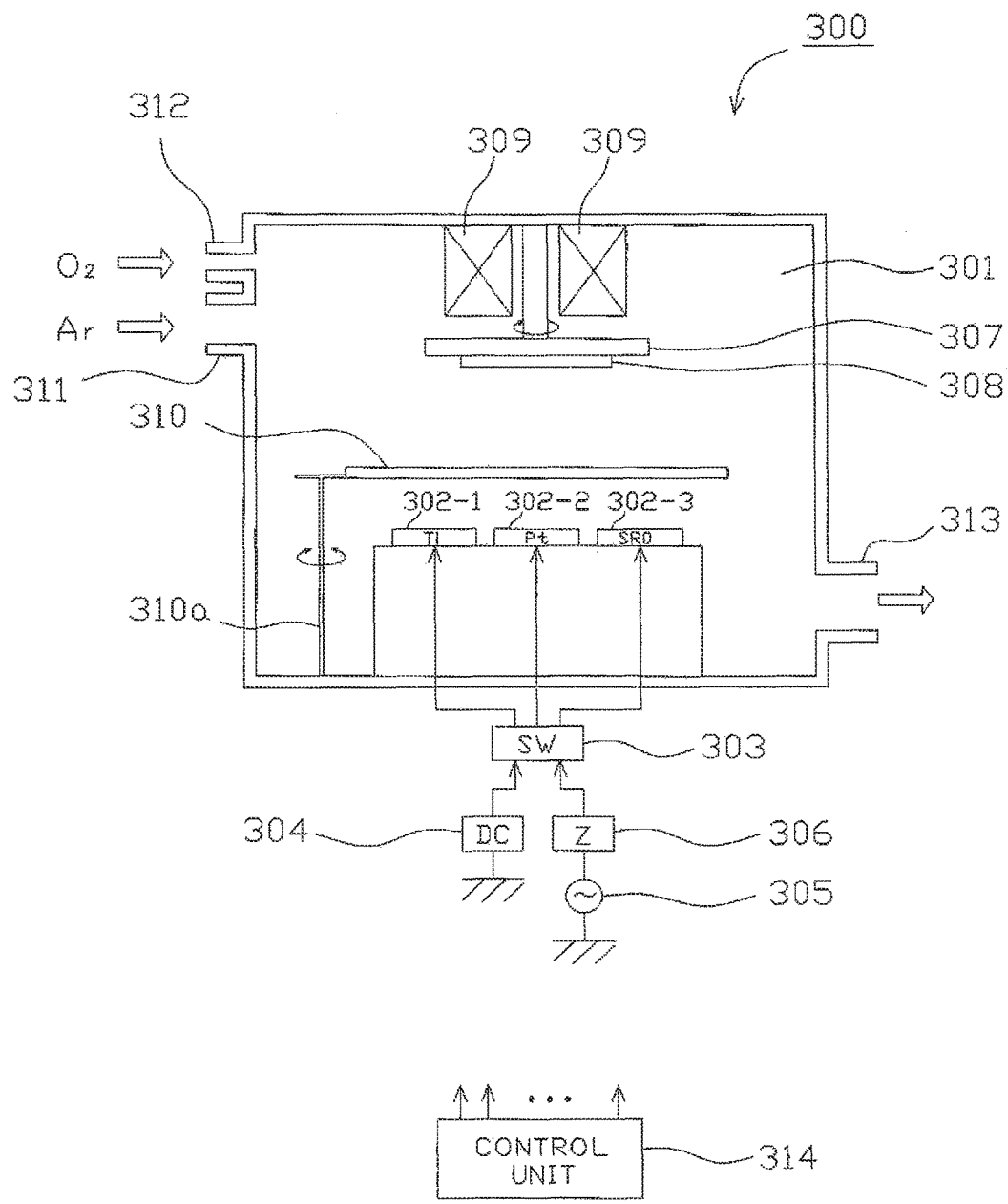
FIG. 3 is a diagram illustrating a DC/RF magnetron
sputtering apparatus used for manufacturing the piezoelectric device of FIG. 2.
Figure 4:
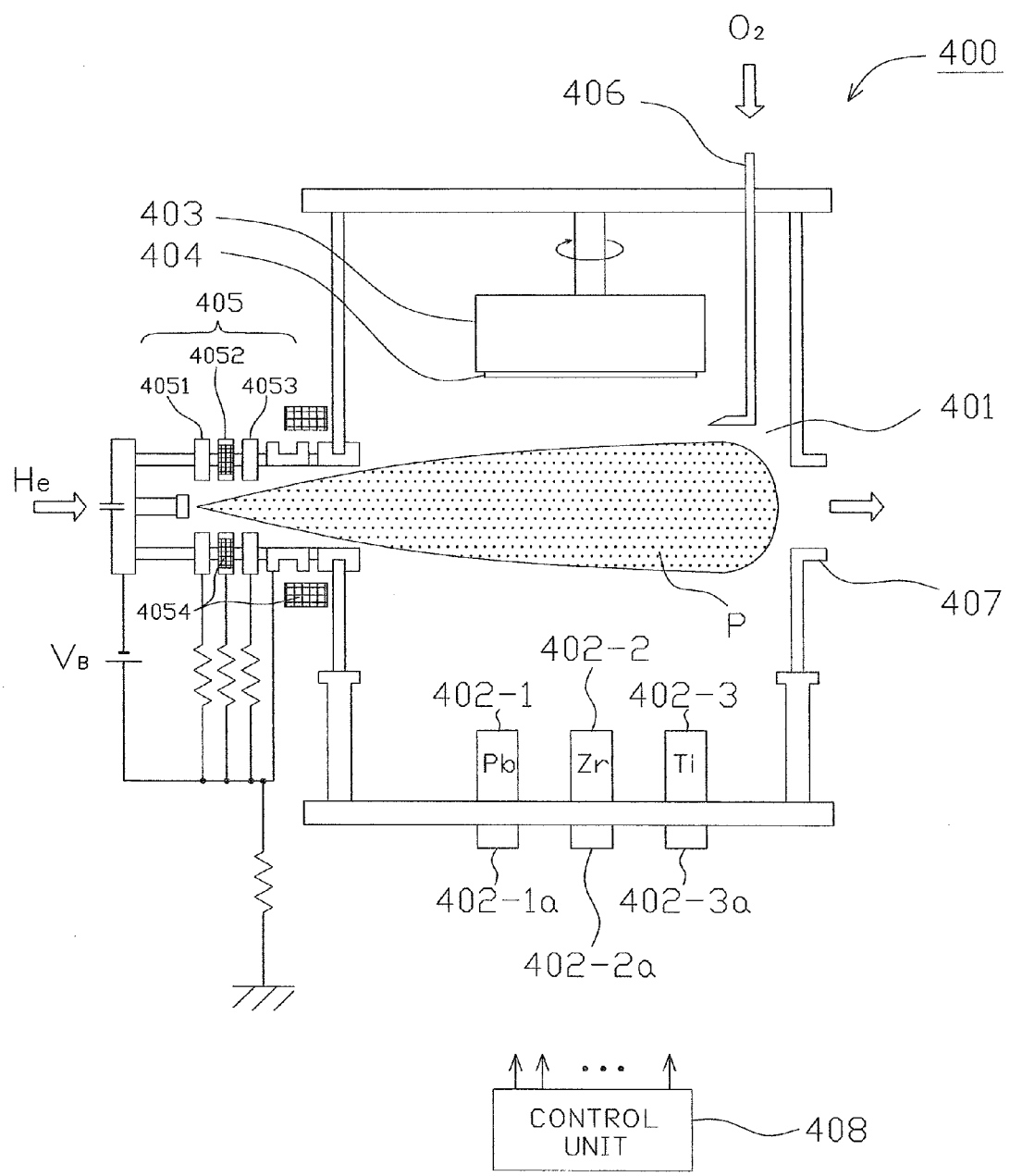
FIG. 4 is a diagram for illustrating an arc discharge
reactive ion plating (ADRIP) apparatus used for manufacturing the piezoelectric device of FIG. 2.

The Ti layer 3-1, the Pt layer 3-2, the SRO layer 3-3 and
the SRO layer 4-2 are formed by a DC/RF magnetron
sputtering apparatus as illustrated in FIG. 3 which will be
explained later in detail, and the PZT layers 4-1 and 4-3 are
formed by an arc discharge reactive ion plating (ADRTP)
apparatus as illustrated in FIG. 4 which will be explained
later in detail.

In the piezoelectric structure 4 of FIG. 2, the continuity of
the PZT layers 4-1 and 4-3 is interrupted by the SRO layer
4-2 which is not electrically connected to the lower electrode
layer 3 and the upper electrode layer 5. As a result, the
segregated Pb components of the grain boundaries 4-1a as
indicated by X1 in the PZT layer 4-1 and the segregated Pb
components of the grain boundaries 4-3a as indicated by X3
in the PZT layer 4-3 are interrupted by the SRO layer 4-2.
Note that, voltages are applied to the lower electrode layer
3 and the upper electrode layer 5, so that vertical electrical
fields are generated along the thickness direction of the
piezoelectric structure 4; however, horizontal electrical
fields are hardly generated in the SRO layer 4-2, so that
currents hardly flow through the SRO layer 4-2 in spite of
the fact that the SRO layer 4-2 is conductive.

Figure 1:
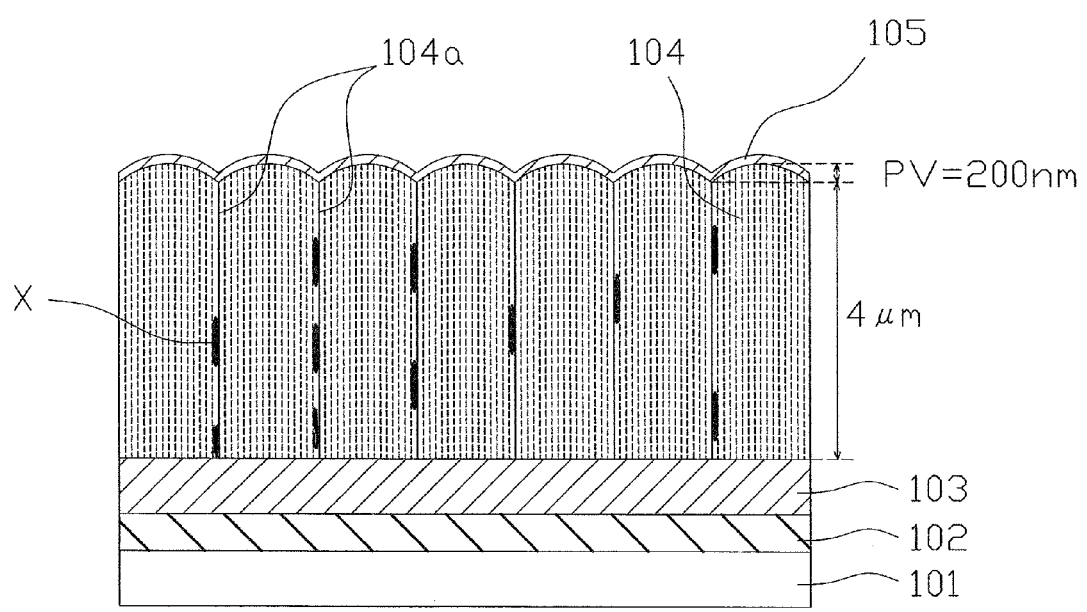
FIG. 1 is a cross-sectional view for explaining a first prior
art method for manufacturing a piezoelectric device by a dry
deposition process.

Also, as illustrated in FIG. 2, the grain boundaries 4-3a of
the PZT layer 4-3 usually do not coincide with the grain
boundaries 4-1a of the PZT layer 4-1. Further, each of the
PZT layers 4-1 and 4-3 is thinner than the PZT layer 4 of
FIG. 1. As a result, the roughness of the top surface of the
PZT layer 4-3 would become small, so that the peak-to-valley (PV) value would be about 50 nm.

Further, immediately after the formation of the PZT layer
4-1, the SRO layer 4-2 can be formed on the PZT layer 4-1
by the system of FIG. 5 which will be explained later, so that
Pb can be prevented from being evaporated from the PZT
layer 4-1.

Furthermore, the SRO layer 4-2 has a similar crystalline
structure to that of the PZT layers 4-1 and 4-3. That is, the
PZT layers 4-1 and 4-3 are perovskite, and also, the SRO
layer 4-2 is perovskite. Therefore, the lattice constant of the
PZT layers 4-1 and 4-3 is close to that of the SRO layer 4-2,
so that the PZT layer 4-1, the SRO layer 4-2 and the PZT
layer 4-3 can be epitaxially grown. As a result, the piezoelectric structure 4 formed by the PZT layer 4-1, the SRO
layer 4-2 and the PZT layer 4-3 has an excellent piezoelectric property as compared with the PZT layer 4 of FIG. 1.
Thus, even when the piezoelectric device of FIG. 2 is driven,
cracks would hardly be generated in the piezoelectric structure 4.

In FIG. 2, the PZT layers 4-1 and 4-3 can be replaced by
another perovskite piezoelectric layer made of one of lead
niobate titanate zirconate (PNZT), lead lanthane titanate
zirconate (PLZT), lead lanthane titanate (PLT), lead magneciumate niobate (PMN) and lead manganate niobate
(PMNN). Also, the SRO layer 4-2 can be replaced by another perovskite conductive layer made of one of larithan nickel oxide LaNiO$_3$ (LNO) and barium ruthenium oxide BaRuO$_3$ (BRO).

In FIG. 3, which illustrates a DC/RF magnetron sputtering apparatus 300 used for manufacturing the Ti layer 3-1, the Pt layer 3-2, the SRO layers 3-3 and 4-2 and the upper electrode layer 5 of FIG. 2, the DC/RF magnetron sputtering apparatus 300 is constructed by a vacuum chamber 301.

Provided at a bottom portion of the vacuum chamber 301 are a Ti target 302-1, a Pt target 302-2 and an SRO target 302-3. The Ti target 302-1, the Pt target 302-2 and the SRO target 302-3 are connected to a switch circuit 303 which is connected to a DC bias circuit 304 and an RF bias circuit 305 along with an impedance matching circuit 306.

Also, provided at an upper portion of the vacuum chamber 301 are a substrate rotating holder 307 for mounting a substrate (wafer) 308 and a heater 309 for heating the substrate 308.

Further, provided between the targets 302-1, 302 and 303 and the substrate rotating holder 307 is a shutter 310 rotated by a rotating axis 310a in order to shield the targets 302-1, 302-2 and 302-3.

Furthermore, provided at an upstream side of the vacuum chamber 301 are an Ar gas inlet pipe 311 for introducing Ar gas thereinto and an O$_2$ gas inlet pipe 312 for introducing O$_2$ gas thereinto. The amounts of the Ar gas and the O$_2$ gas introduced into the vacuum chamber 301 can be adjusted by mass flow units (not shown). On the other hand, provided at a downstream side of the vacuum chamber 301 is an exhaust pipe 313 coupled to a vacuum pump (not shown).

A control unit 314, which is constructed by a microcomputer or the like, controls the switch circuit 303, the substrate rotating holder 307, the heater 309, the shutter 310, the amounts of the Ar gas and the O$_2$ gas, the chamber pressure within the vacuum chamber 301, and the like.

When depositing the Ti layer 3-1, the Pt layer 3-2 or 5 of FIG. 2, the switch circuit 303 is controlled by the control unit 314, so that the DC bias circuit 304 is connected to the Ti target 302-1 or the Pt target 302-2. Also, the following conditions are established:

the substrate temperature: 300° C.
the chamber pressure: 0.5 Pa
the ratio Ar/O$_2$=9:1

When depositing the SRO layer 3-3 or 4-2 of FIG. 2, the switch circuit 303 is controlled by the control unit 314, so that the RF bias circuit 305 along with the impedance matching circuit 306 is connected to the SRO target 302-3. Also, the following conditions are established:

the substrate temperature: 600° C.
the chamber pressure: 0.8 Pa
the ratio Ar/O$_2$=40:1

After the RF magnetron sputtering process, the substrate temperature is lowered to be 300° C.

In FIG. 4, which illustrates an ADRIP apparatus 400 used for manufacturing the PZT layers 4-1 and 4-3 of FIG. 2, the ADRIP apparatus 400 is constructed by a vacuum chamber 401.

Provided at a bottom portion of the vacuum chamber 401 is a Pb evaporation source 402-1, a Zr evaporation source 402-2 and a Ti evaporation source 402-3 for independently evaporating Pb, Zr and Ti, respectively. Also, the Pb evaporation source 402-1, the Zr evaporation source 402-2 and the Ti evaporation source 402-3 incorporate electron beam heaters 402-1a, 402-2a and 402-3a, respectively, and are associated with a Pb evaporation amount sensor, a Zr evaporation amount sensor and a Ti evaporation amount sensor (not shown), respectively, for detecting Pb, Zr and Ti evaporation amounts within the vacuum chamber 401. Therefore, the electron beam heaters 402-1a, 402-2a and 402-3a can be feedback-controlled by the output signals of the Pb evaporation amount sensor, the Zr evaporation amount sensor and the Ti evaporation amount sensor, respectively.

Also, provided at an upper portion of the vacuum chamber 401 is a heater incorporating substrate (wafer) rotating holder 403 for mounting a substrate (wafer) 404.

Further, provided at an upstream side of the vacuum chamber 401 are a pressure gradient type arc discharge plasma gun 405 for introducing insert carrier gas such as He gas thereinto and an O$_2$ gas inlet pipe 406 for introducing reactive O$_2$ gas thereinto as material for the PZT layers 4-1 and 4-3. The amounts of the He gas and the O$_2$ gas can be adjusted by mass flow units (not shown). On the other hand, provided at a downstream side of the vacuum chamber 401 is an exhaust pipe 407 coupled to a vacuum pump (not shown).

In more detail, the pressure gradient type arc discharge plasma gun 405 includes a cathode electrode 4051, intermediate electrodes 4052, an anode electrode 4053, and electromagnetic coils 4054.

A control unit 408 such as a microcomputer is provided to control the entire ADRIP apparatus of FIG. 4. Particularly, the control unit 408 receives signals from the evaporation amount sensors to control the evaporation sources 402-1, 402-2 and 402-3 as well as the pressure gradient type arc discharge plasma gun 405.

When the ADRIP apparatus of FIG. 4 carries out an ADRIP process, the control unit 408 operates the pressure gradient type arc plasma gun 405 to receive He gas at 100 sccm while a DC bias voltage $V_B$=120V is applied to the cathode electrode 4051 and the anode electrode 4053 and a magnetic field of about 0.03 T (300 Gauss) is generated to generate arc discharge plasma P at a high plasma density higher than $10^{12}$ cm$^{-3}$ and at a low electron temperature. Also, the control unit 408 introduces reactive O$_2$ gas at 300 sccm into the vacuum chamber 401. As a result, a large amount of active atoms and active molecules such as oxygen radicals are generated. On the other hand, Pb vapor, Zr vapor and Ti vapor generated from the Pb evaporation source 402-1, the Zr evaporation source 402-2 and the Ti evaporation source 402-3 react with the above-mentioned active atoms and active molecules and are deposited on the substrate (wafer) 404 heated at about 600° C. As a result, PbZr$_x$Ti$_{1-x}$O$_3$ with a composition ratio x which is typically 0.53 is formed on the substrate (wafer) 404.

Figure 5:
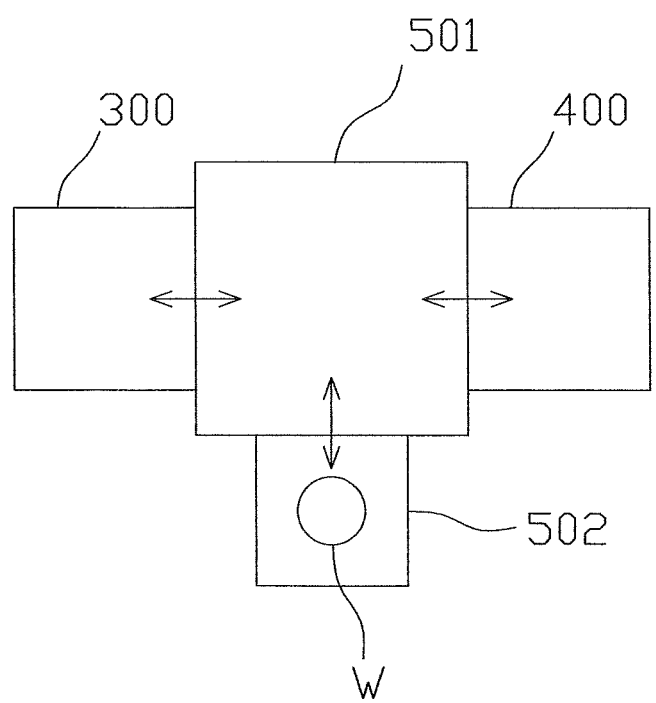
FIG. 5 is a diagram for illustrating a system for manufacturing the piezoelectric device of FIG. 2.

In FIG. 5, which is a diagram illustrating a system for manufacturing the piezoelectric device of FIG. 2, a carrier vacuum chamber 501 linked to the DC/RF magnetron sputtering apparatus 300 of FIG. 3 and the ADRIP apparatus of FIG. 4 is provided. Also, a load/lock chamber 502 is linked to the carrier chamber 501. In FIG. 5, a substrate (wafer) W can be moved between the DC/RF magnetron sputtering apparatus 300 and the ADRIP apparatus 400 by opening and closing gate valves (not shown) between the carrier vacuum chamber 501 and the DC/RF magnetron sputtering apparatus 300 and the ADRIP apparatus 400. Thus, the PZT layer 4-1, the SRO layer 4-2 and the PZT layer 4-3 can be sequentially or continuously formed to enhance the throughput.

The piezoelectric device of FIG. 2 is applied to a two-dimensional optical deflector as illustrated in FIG. 6. This two-dimensional optical deflector can be used in a bar code reader, a pico projector or the like.

In FIG. 6, reference numeral 610 designates a two-dimensional optical deflector, 620 designates a control unit for driving the optical deflector 610, and 630 designates a laser light source.

The optical deflector 610 is constructed by a circular mirror 601 for reflecting incident light L from the laser light source 630, a pair of torsion bars 602a and 602b coupled to the mirror 601 along an X-axis, an inner frame (movable frame) 603 surrounding the mirror 601 and the torsion bars 602a and 602b for supporting the mirror 601, a semi-ring shaped inner piezoelectric actuator 604a coupled between the torsion bars 602a and 602b and supported by an inner coupling portion 603a of the inner frame 603, and a semi-ring shaped inner piezoelectric actuator 604b coupled between the torsion bars 602a and 602b and supported by an inner coupling portion 603b of the inner frame 603. In this case, the inner frame 603 has a circular inner circumference along the inner piezoelectric actuators 604a and 604b, and a rectangular outer circumference. The flexing direction of the inner piezoelectric actuator 604a is opposite to that of the inner piezoelectric actuator 604b, so that the inner piezoelectric actuators 604a and 604b serve as cantilevers for rocking the mirror 601 around the X-axis.

Also, the optical deflector 610 includes an outer frame (fixed frame) 605 and a pair of meander-type outer piezoelectric actuators 606a and 606b coupled between outer coupling portions 603c and 603d of the inner frame 603 and inner coupling portions 605a and 605b of the outer frame 605 and serving as cantilevers for rocking the mirror 601 around a Y-axis on the plane of the mirror 601 centered at the center O of the mirror 601. The outer piezoelectric actuators 606a and 606b are arranged opposite to each other with respect to the mirror 601.

The mirror 601 can be square, rectangular, polygonal or elliptical. In this case, the inner-circumference of the inner frame 603 is adapted to the shape of the mirror 601.

In more detail, the torsion bars 602a and 602b have ends coupled to the outer circumference of the mirror 601 and other ends coupled to the inner circumference of the inner frame 603. Therefore, the torsion bars 602a and 602b are twisted by the inner piezoelectric actuators 604a and 604b to rock the mirror 601 around the X-axis.

The outer frame 605 is rectangular-framed to surround the inner frame 603 associated with the meander-type outer piezoelectric actuators 606a and 606b.

The semi-ring shaped inner piezoelectric actuators 604a and 604b and the meander-type outer piezoelectric actuators 606a and 606b are constructed by the piezoelectric device of FIG. 2.

The meander-type outer piezoelectric actuator 606a is constructed by piezoelectric cantilevers 606a-1, 606a-2, 606a-3 and 606a-4 which are serially-coupled from the coupling portion 605a of the outer frame 605 to the coupling portion 603c of the inner frame 603 via folded portions. Also, each of the piezoelectric cantilevers 606a-1, 606a-2, 606a-3 and 606a-4 is in parallel with the X-axis. Therefore, the piezoelectric cantilevers 606a-1, 606a-2, 606a-3 and 606a-4 are folded at every cantilever or meandering from the outer frame 605 to the inner frame 603, so that the amplitudes of the piezoelectric cantilevers 606a-1, 606a-2, 606a-3 and 606a-4 can be changed along directions perpendicular to the Y-axis.

Similarly, the meander-type outer piezoelectric actuator 606b is constructed by piezoelectric cantilevers 606b-i, 606b-2, 606b-3 and 606b-4 which are serially-coupled from the coupling portion 605b of the outer frame 605 to the outer coupling portion 603d of the inner frame 603 via folded portions. Also, each of the piezoelectric cantilevers 606b-1, 606b-2, 606b-3 and 606b-4 are in parallel with the X-axis. Therefore, the piezoelectric cantilevers 606b-1, 606b-2, 606b-3 and 606b-4 are folded at every cantilever or meandering from the outer frame 605 to the inner frame 603, so that the piezoelectric cantilevers 606b-1, 606b-2, 606b-3 and 606b-4 can be changed along directions perpendicular to the Y-axis.

Figure 7A:
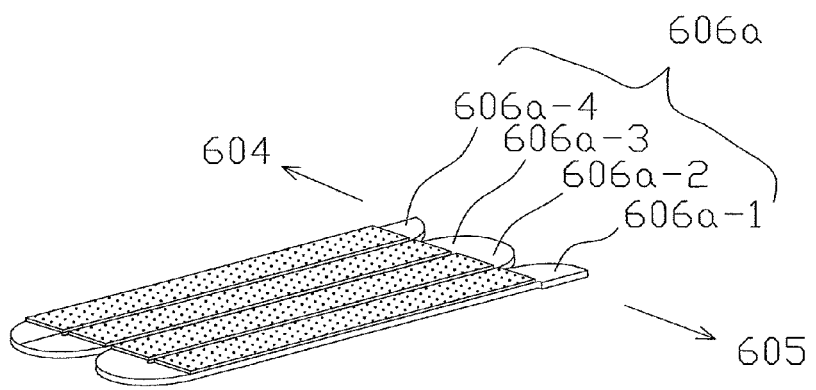
FIGS. 7A and 7B are diagrams for illustrating the operation of the meander-type outer piezoelectric actuator of FIG.
6.
Figure 7B:
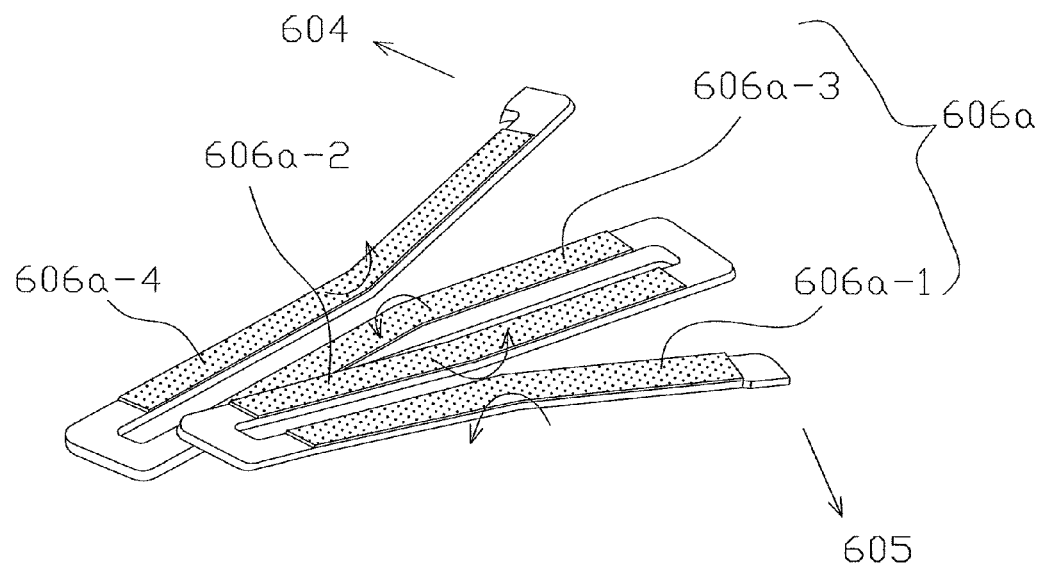

The meander-type outer piezoelectric actuators 606a and 606b operate as follows with reference to FIGS. 7A and 7B.

In the outer piezoelectric actuators 606a and 606b, the piezoelectric cantilevers 606a-1, 606a-2, 606a-3, 606a-4, 606b-1, 606b-2, 606b-3 and 606b-4 are divided into an odd-numbered group of the piezoelectric cantilevers 606a-1 and 606a-3; 606b-1 and 606b-3, and an even-numbered group of the piezoelectric cantilevers 606a-2 and 606a-4; 606b-2 and 606b-4 alternating with the odd-numbered group of the piezoelectric cantilevers 606a-1 and 606a-3; 606b-1 and 606b-3.

For example, when the odd-numbered group of the piezoelectric cantilevers 606a-1, 606a-3, 606b-1 and 606b-3 are flexed in one direction, for example, in an upward direction, the even-numbered group of the piezoelectric cantilevers 606a-2, 606a-4, 606b-2 and 606b-4 are flexed in the other direction, i.e., in a downward direction. On the other hand, when the odd-numbered group of the piezoelectric cantilevers 606a-1, 606a-3, 606b-1 and 606b-3 are flexed in the downward direction, the even-numbered group of the piezoelectric cantilevers 606a-2, 606a-4, 606b-2 and 606b-4 are flexed in the upward direction.

Thus, the mirror 601 is rocked around the Y-axis.

Note that the number of piezoelectric cantilevers in each of the outer piezoelectric actuators 606a and 606b can be other values such as 3, 5, 6, 7, . . . .

Provided on the outer frame 605 are pads $P_{Ga}$, $P_{Xa}$, $P_{Y1a}$, $P_{Y2a}$, $P_{Gb}$, $P_{Xb}$, $P_{Y1b}$ and $P_{Y2b}$ which are connected to the control unit 620. The control unit 620 applies a drive voltage $V_{X1}$ the pad $P_{Xa}$ and applies a drive voltage $V_{X2}$ to the pad $P_{Xb}$. The drive voltages $V_{X1}$ and $V_{X2}$ are sinusoidal, and the drive voltage $V_{X1}$ opposite in phase to the drive voltage $V_{X2}$. For example, the frequency $f_X$ of the drive voltages $V_{X1}$ and $V_{X2}$ is one resonant frequency $f_r$ such as 25 kHz depending upon a resonant structure formed by the mirror 601, the torsion bars 602a and 602b and the inner piezoelectric actuators 604a and 604b. On the other hand, the control unit 620 applies a drive voltage $V_{Y1}$ to the pads $P_{Y1a}$ and $P_{Y1b}$, and applies a drive voltage $V_{Y2}$ the pads $P_{Y2a}$ and $P_{Y2b}$. The drive voltages $V_{Y1}$ and $V_{Y2}$ are sinusoidal or saw-tooth-shaped, and the drive voltage $V_{Y1}$ is opposite in phase to the drive voltage $V_{Y2}$. For example, the frequency $f_Y$ of the drive voltages $V_{Y1}$ and $V_{Y2}$ is 60 Hz, much lower than the resonant frequency $f_r$.

The pad $P_{Ga}$, which is grounded, is connected via a via-structure (not shown) to the lower electrode layers of the inner piezoelectric actuator 604a and the piezoelectric cantilevers 606a-1, 606a-2, 606a-3 and 606a-4 of the outer piezoelectric actuator 606a.

The pad $P_{Gb}$, which is grounded, is connected via a via-structure (not shown) to the lower electrode layers of the inner piezoelectric actuator 604b and the piezoelectric cantilevers 606b-1, 606b-2, 606b-3 and 606b-4 of the outer piezoelectric actuator 606b.

Figure 8:
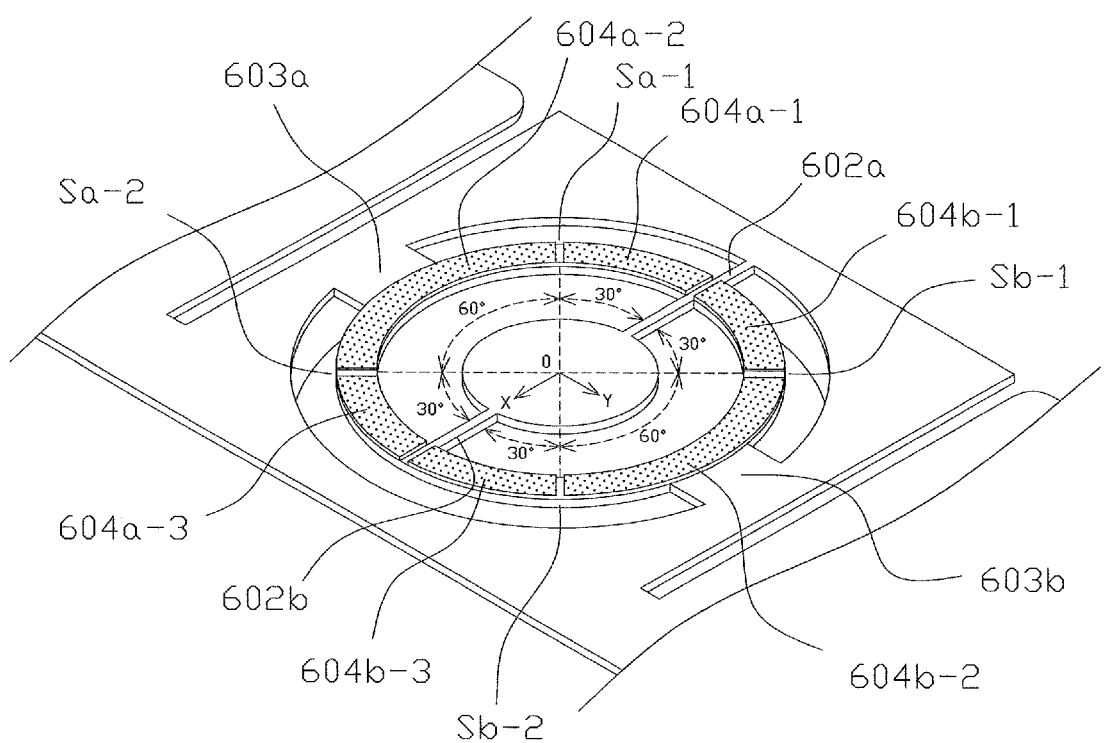
FIG. 8 is a detailed perspective view of the semi-ring
shaped inner piezoelectric actuators of FIG. 6.

In FIG. 8, which is a detailed perspective view of the semi-ring shaped inner piezoelectric actuators 604a and 604b of FIG. 6 (see: U. S. Patent Application Publication No. 2014/0355088A1), the semi-ring shaped inner piezoelectric actuator 604a includes piezoelectric portions 604a-

1, 604a-2 and 604a-3 made of PZT separated by slits Sa-1 and Sa-2 at an angle of 60°, and the semi-ring shaped inner piezoelectric actuator 604b includes piezoelectric portions 604b-1, 604b-2 and 604b-3 made of PZT separated by slits Sb-1 and Sb-2 at an angle of 60°. In this case, the drive voltage $V_{X1}$ applied to the piezoelectric portions 604a-1 and 604a-3 of the semi-ring shaped inner piezoelectric actuator 604a and the piezoelectric portion 604b-2 of the semi-ring shaped inner piezoelectric actuator 604b, while the drive voltage $V_{X2}$ opposite in phase to the drive voltage $V_{Y1}$ is applied to the piezoelectric portion 604a-2 of the semi-ring shaped inner piezoelectric actuator 604a and the piezoelectric portions 604b-1 and 604b-3 of the semi-ring shaped inner piezoelectric actuator 604b.

According to the separated piezoelectric portions 604a-1, 604a-2 and 604a-3 of the semi-ring shaped piezoelectric actuator 604a and the separated piezoelectric portions 604b-1, 604b-2 and 604b-3 of the semi-ring shaped piezoelectric actuator 604b, the same rocking angle of the mirror 601 along the X-axis can be realized by smaller amplitudes of the drive voltages $V_{Y1}$ and $V_{Y2}$, so that the power consumption can be decreased and the deterioration of the piezoelectric portions made of PZT can be suppressed to enhance the reliability.

A method for manufacturing the two-dimensional optical deflector of FIG. 6 will be explained in more detail with reference to FIGS. 9A through 9T.

Figure 9A:
FIGS. 9A through 9T are cross-sectional views for
explaining a method for manufacturing the two-dimensional
optical deflector of FIG. 6.

First, referring to FIG. 9A, an SOI wafer 1 formed by an about 50 μm thick monocrystalline silicon active layer ("Device" layer) 1-1, an about 2 μm thick intermediate (buried) silicon dioxide layer ("Box" layer) 1-2 and an about 400 μm thick monocrystalline silicon support layer ("Handle" layer) 1-3 is prepared. Specifically, the active layer 1-1 corresponds to the substrate 1 of FIG. 2.

Figure 9B:
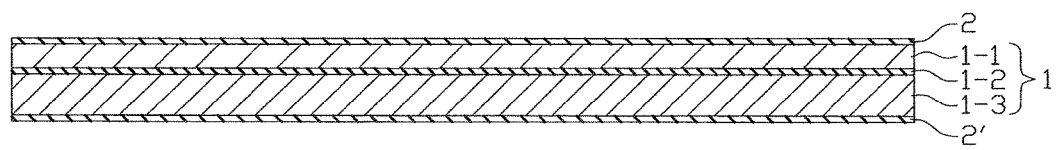

Next, referring to FIG. 9B, the SOI wafer 1 is oxidized by a thermal oxidation process, so that about 500 nm thick silicon dioxide layers 2 and 2' are formed on both surfaces of the SOI wafer 1.

Figure 9C:
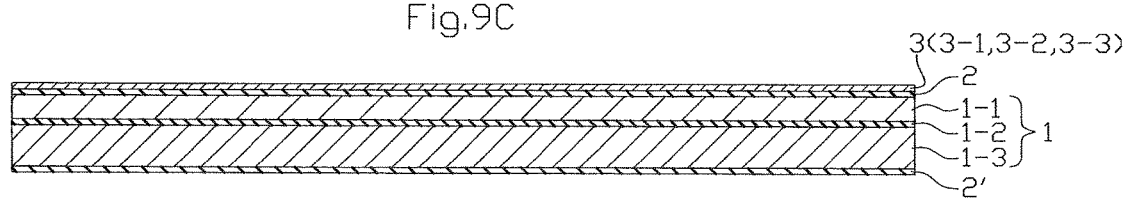

Next, referring to FIG. 9C, a Ti/Pt/SRO lower electrode layer 3 consisting of an about 50 nm thick Ti layer 3-1, an about 150 nm thick Pt layer 3-2 on the Ti layer 3-1 and an about 100 nm thick SRO layer 3-3 on the Pt layer 3-2 is deposited on the silicon dioxide layer 2 by a DC magnetron sputtering process, an RF magnetron sputtering process and an RF magnetron sputtering process using the DC/RF magnetron sputtering apparatus 300 of FIG. 3.

Figure 9D:
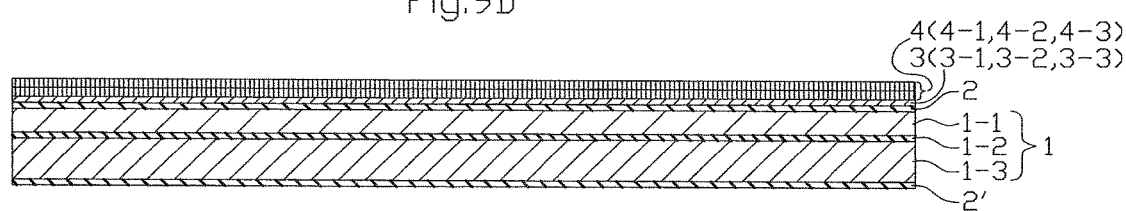

Next, referring to FIG. 9D, an about 4 μm thick piezoelectric structure 4 is formed. In more detail, an about 2 μm thick PZT layer 4-1 is deposited on the lower electrode layer 3 by an arc discharge reactive ion plating (ADRIP) process at a temperature of about 500° C. to 600° C. using the ADRIP apparatus 400 of FIG. 4. Then, an about 50 nm SRO layer 4-2 is deposited on the PZT layer 4-1 by an RF magnetron sputtering process using the DC/RF magnetron sputtering apparatus 300 of FIG. 3. Then, an about 2 μm thick PZT layer 4-3 is deposited on the SRO layer 4-2 by an arc discharge reactive ion plating (ADRIP) process at a temperature of about 500° C. to 600° C. using the ADRIP apparatus 400 of FIG. 4.

Figure 9E:
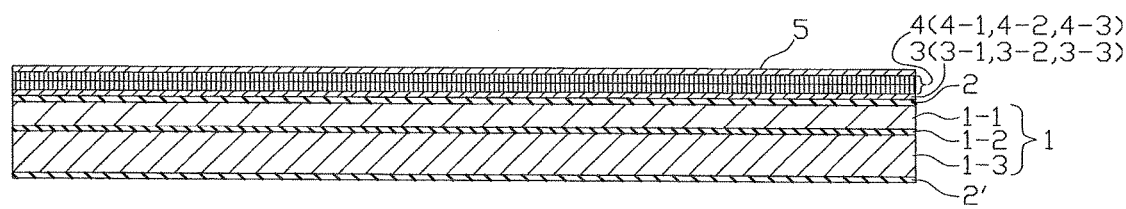

Next, referring to FIG. 9E, an about 150 nm thick Pt upper electrode layer 5 is deposited on the piezoelectric structure 4 by an DF magnetron sputtering process using the DC/RF magnetron sputtering apparatus 300 of FIG. 3.

Figure 9F:
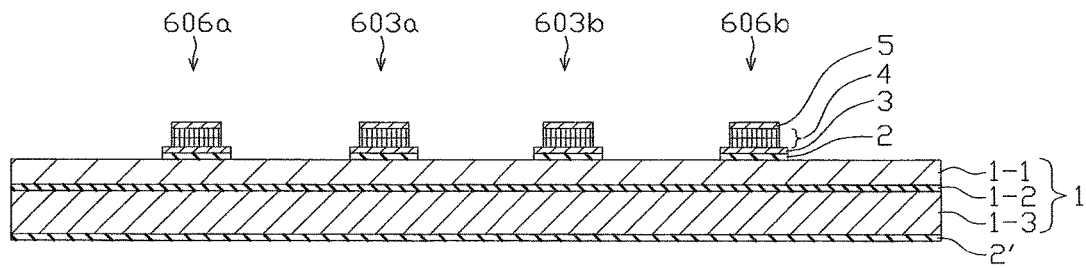

Next, referring to FIG. 9F, the upper electrode layer 5 and the piezoelectric structure 4 are patterned by photolithography and dry etching process. Then, the lower electrode layer 3 and the silicon dioxide layer 2 are patterned by a photolithography and dry etching process. Thus, the inner piezoelectric actuators 604a and 604b and the outer piezoelectric actuators 606a and 606b are formed.

Figure 9G:
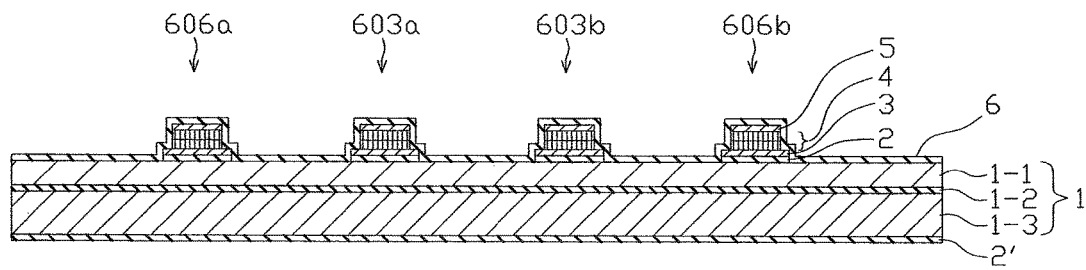

Next, referring to FIG. 9G, an about 500 nm thick silicon dioxide interlayer 6 is formed on the entire surface by a plasma chemical vapor deposition (PCVD) process.

Figure 9H:
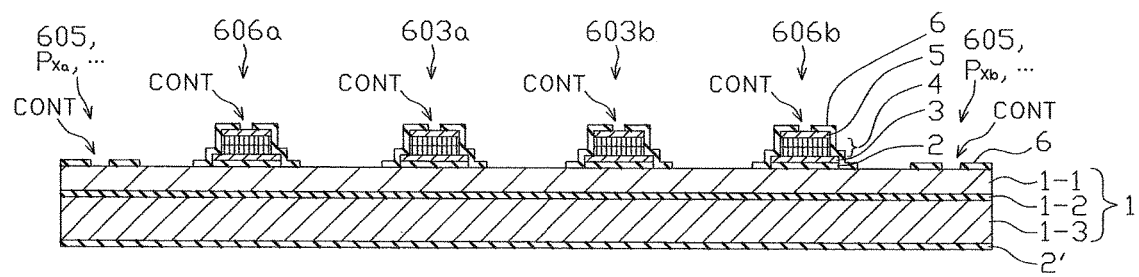

Next, referring to FIG. 9H, contact holes CONT are perforated in the silicon dioxide interlayer 6 by a photolithography and dry etching process. The contact holes CONT correspond to the inner piezoelectric actuators 603a and 603b, the outer piezoelectric actuators 606a and 606b and the pads $P_{Xa}$, $P_{Y1a}$, $P_{Y2a}$, $P_{Ga}$, $P_{Xb}$, $P_{Y1b}$, $P_{Y2b}$ and $P_{Gb}$.

Figure 9I:
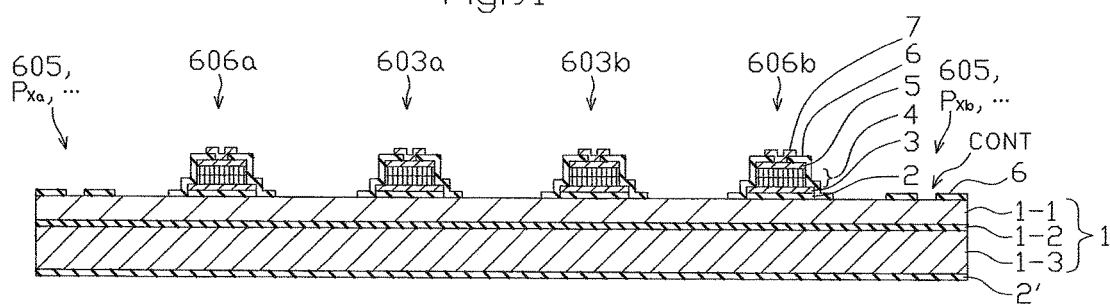

Next, referring to FIG. 9I, wiring layers 7 made of AlCu (1% Cu) are formed by a photolithography process, a sputtering process, and a lift-off process. The wiring layers 7 are electrically connected between the upper electrode layers 5 of the inner piezoelectric actuators 604a and 604b, and the outer piezoelectric actuators 606a and 606b and their corresponding pads $P_{Xa}$, $P_{Y1a}$, $P_{Y2a}$, $P_{Ga}$, $P_{Xb}$, $P_{Y1b}$, $P_{Y2b}$ and $P_{Gb}$.

Figure 9J:
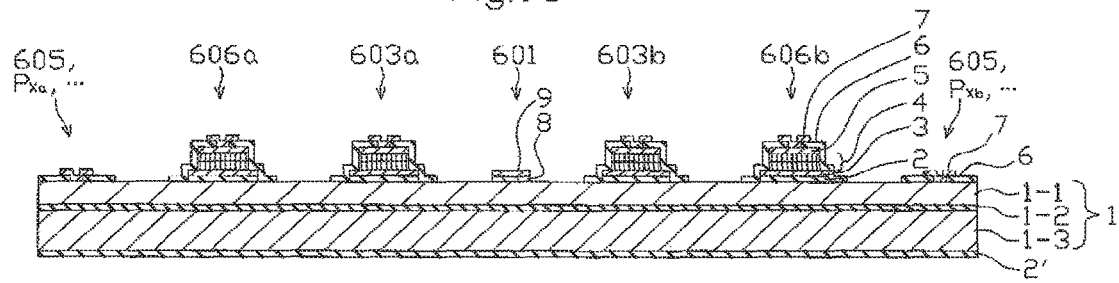

Next, referring to FIG. 9J, a Ti layer 8 and Ag reflective layer 9 are sequentially formed by sputtering processes and a lift-off process to form the mirror 601. Note that the sputtering processes can be carried out by the DC/RF magnetron sputtering apparatus 300 where a Ag target is added.

Figure 9K:
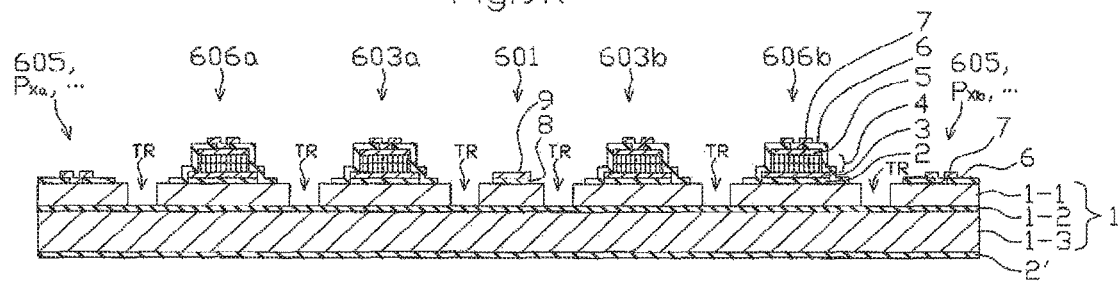

Next, referring to FIG. 9K, trenches TR are formed by a deep reactive ion etching (DRIE) process using the silicon dioxide layer 102 as an etching stopper. The trenches TR are used for separating the mirror 601, the torsion bars 602a and 602b, the inner frame 603, the inner piezoelectric actuator 604a and 604b, the outer frame 605, and the outer piezoelectric actuators 606a and 606b.

Figure 9L:
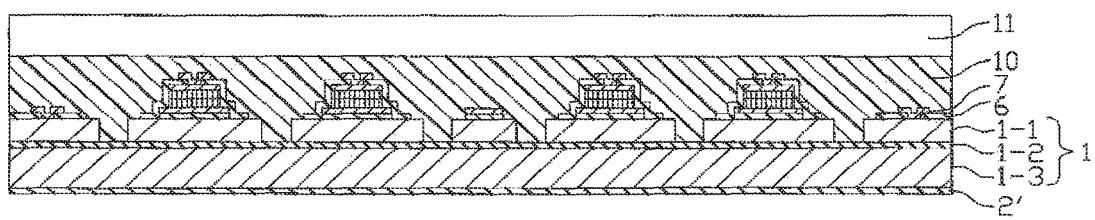

Next, referring to FIG. 9L, a wax layer 10 is coated on the entire front surface by a spinner or the like, and a support wafer 11 is temporarily bonded to the wax layer 10 at a substrate temperature of about 100° C. to 150° C. while applying a weight on the support wafer 11. In this case, if the bonding operation of the support wafer 11 upon the wax layer 10 is carried out in a vacuum state, the support wafer 11 can be surely bonded to the wax layer 10 without air voids.

Figure 9M:
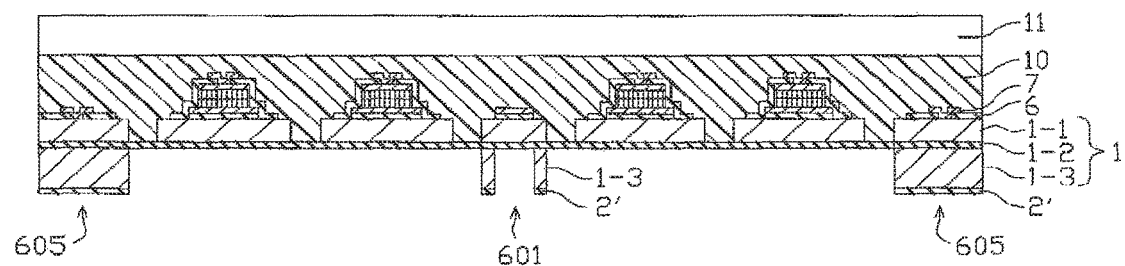

Next, referring to FIG. 9M, the silicon dioxide layer 2' is patterned by a photolithography and dry etching process, so that the silicon dioxide layer 2' is left in an area corresponding to a rib structure of the mirror 601 and the outer frame 605. Then, the support layer 103 is etched by a deep reactive ion etching (DRIE) process using the silicon dioxide layer 2' as an etching mask.

Next, referring to FIG. 9N, the silicon dioxide layer 2' on the rib structure of the mirror 601 is removed by a photolithography and dry etching process. Then, the support layer 1-3 is a little shortened by a photolithography process and a reactive ion etching (RIE) process to be a support layer 1-3'.

Next, referring to FIG. 9O, the buried silicon dioxide layer 1-2 and the silicon dioxide layer 2' are etched by a wet etching process using buffered fluoric acid. Thus, an opening OP is perforated in the support layer 1-3 to realize a rocking space of the mirror 601 in the opening OP.

Next, referring to FIG. 9P, an ultraviolet type dicing tape 12A is adhered to the support wafer 11.

Next, referring to FIG. 9Q, the device is reversed. Then, the ultraviolet type dicing tape 12A is diced along a dicing line DL for every support wafer 11 by a blade dicing apparatus (not shown).

Figure 9R:
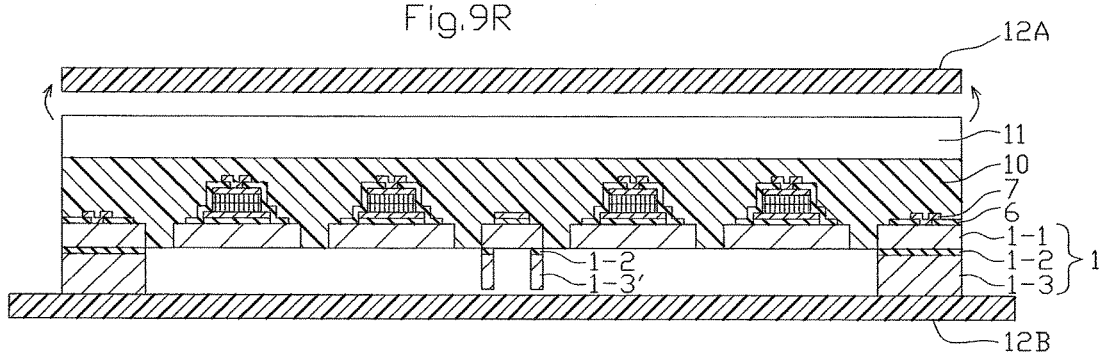

Next, referring to FIG. 9R, another ultraviolet type dicing tape 12B is adhered to the support layer 103. Then, the ultraviolet type dicing tape 12A is peeled by irradiating it with ultraviolet.

Figure 9S:
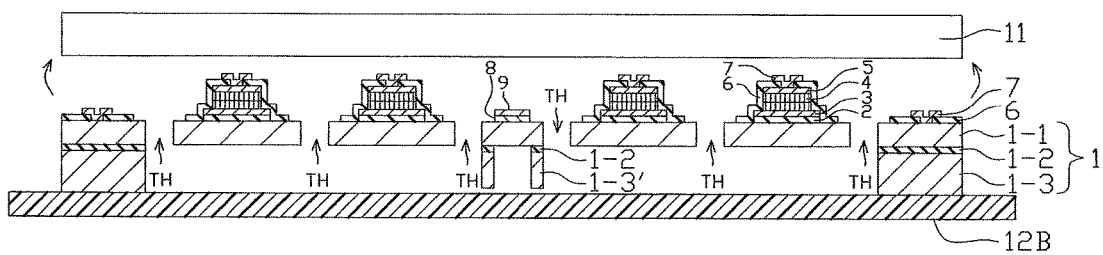

Next, referring to FIG. 9S, the device is immersed in an isopropyl alcohol (IPA) solution for several tens of minutes to several hours, so that the wax layer 11 is melted in the IPA solution and is removed. As a result, trenches TR are converted into through holes TH.

Figure 9T:
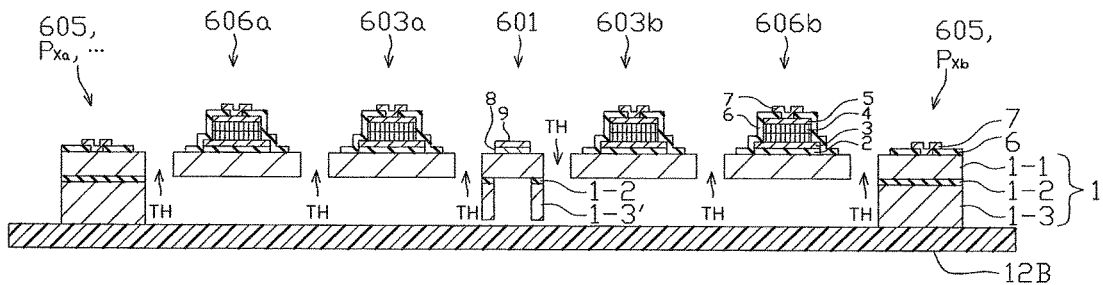

Finally, referring to FIG. 9T, the device is cleaned by an organic solvent such as IPA, and dried, thus completing the device.

According to the inventor's experiment, when the two-dimensional optical deflector of FIG. 6 using the piezoelectric device of FIG. 2 was operated at a non-resonant frequency of 60 Hz of saw-tooth drive voltages $V_{y1}$ and $V_{y2}$ whose peak-to-peak voltage $V_{PP}$ is 60V having a duty-ratio of 8:2 for a vertical scanning, the rejection rate was less than 10%. Contrary to this, the rejection rate for the two-dimensional optical deflector using the piezoelectric device of FIG. 1 was 20%. In this case, the above-mentioned rejection rate was determined for ten samples of two-dimensional optical deflectors, and was calculated by determining whether or not a current density of $1.3 \times 10^{-6}$ A/cm$^2$ has flown through a evaluated two-dimensional optical deflector.

Figure 10:
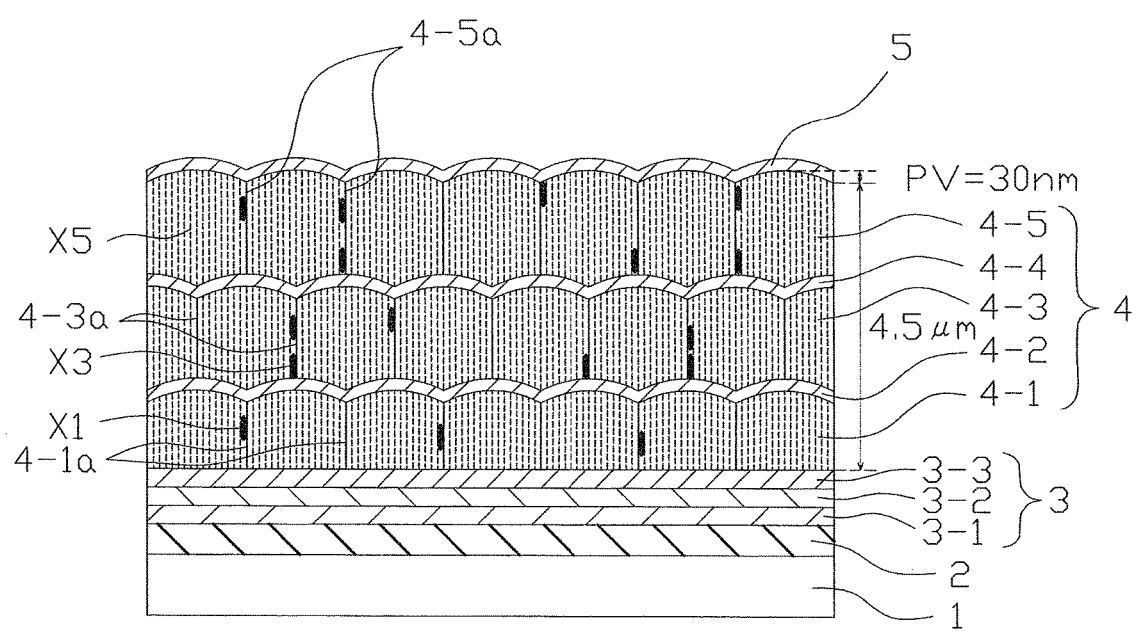
FIG. 10 is a cross-sectional view illustrating a modification of the piezoelectric device of FIG. 2.

In FIG. 10, which illustrates a modification of the piezoelectric device of FIG. 2, the piezoelectric structure 4 of FIG. 2 is replaced by a piezoelectric structure 4' which includes an SRO layer 4-4 and a PZT layer 4-5 in addition to the piezoelectric structure 4 of FIG. 2. In this case, the thickness of the SRO layer 4-4 is the same as that of the SRO layer 4-2, i.e., about 50 nm, and the thicknesses of the PZT layers 4-1, 4-3 and 4-5 are the same as each other, i.e., about 1.5 µm.

In the piezoelectric structure 4' of FIG. 10, the continuity of the PZT layers 4-3 and 4-5 is interrupted by the SRO layer 4-4 which is not electrically connected to the lower electrode layer 3 and the upper electrode layer 5. As a result, the segregated Pb components of the grain boundaries 4-3a as indicated by X3 in the PZT layer 4-3 and the segregated Pb components of the grain boundaries 4-5a as indicated by X3 in the PZT layer 4-5 are interrupted by the SRO layer 4-4. Also, currents hardly flow through the SRO layer 4-4 in spite of the fact that the SRO layer 4-4 is conductive.

Further, as illustrated in FIG. 10, the grain boundaries 4-5a of the PZT layer 4-5 usually do not coincide with the grain boundaries 4-3a of the PZT layer 4-3. Further, each of the PZT layers 4-3 and 4-5 is thinner than the PZT layer 4 of FIG. 1. As a result, the roughness of the top surface of the PZT layer 4-5 would become much smaller, so that the peak-to-valley (PV) value would be about 30 nm.

Further, immediately after the formation of the PZT layer 4-3, the SRO layer 4-4 can be formed on the PZT layer 4-3 by the system of FIG. 5, so that Pb can be prevented from being evaporated from the PZT layer 4-3.

In view of the foregoing, according to the presently disclosed subject matter, a piezoelectric structure generally includes at least one conductive layer such as one SRO layer and multiple piezoelectric layers such as PZT layers sandwiching the conductive layer. That is, the conductive layer is interposed between the piezoelectric layers.

Also, the two-dimensional optical deflector of FIG. 6 can be applied to a one-dimensional optical deflector where the outer frame 605 and the outer piezoelectric actuators 606a and 606b are removed.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A piezoelectric device comprising:
    a substrate;
    an insulating layer provided on said substrate;
    a lower electrode layer provided on said insulating layer;
    a piezoelectric structure provided on said lower electrode layer, said piezoelectric structure including at least one conductive layer and multiple piezoelectric layers sandwiching said conductive layer, said conductive layer having a same crystal structure as that of said piezoelectric layers; and
    an upper electrode layer provided on said piezoelectric structure.

2. The piezoelectric device as set forth in claim 1, wherein said crystal structure is perovskite.

3. The piezoelectric device as set forth in claim 2, wherein each of said piezoelectric layers comprises one of lead zirconate titanate (PZT), lead niobate titanate zirconate (PNZT), lead lanthane titanate zirconate (PLZT), lead lanthane titanate (PLT), lead magneciumate niobate (PMN) and lead manganate niobate (PMNN).

4. The piezoelectric device as set forth in claim 2, wherein said conductive layer comprises one of strontium ruthenium oxide SrRuO$_3$ (SRO), lanthan nickel oxide LaNiO$_3$ (LNO) and barium ruthenium oxide BaRuO$_3$ (BRO).

5. The piezoelectric device as set forth in claim 4, wherein said conductive layer is from 100 nm to 20 nm.

6. An optical deflector comprising:
    a mirror;
    a first frame surrounding said mirror;
    a first piezoelectric actuator comprising said piezoelectric device as set forth in claim 1, coupled between said mirror and said first frame and adapted to rock said mirror around a first axis.

7. The optical deflector as set forth in claim 6, further comprising:
    a second frame surrounding said first frame; and
    a second piezoelectric actuator comprising said piezoelectric device as set forth in claim 1, coupled between said first frame and said second frame and adapted to rock said mirror around a second axis.

8. A method for manufacturing a piezoelectric device comprising:
    forming an insulating layer provided on a substrate;
    forming a lower electrode layer on said insulating layer;
    forming a piezoelectric structure provided on said lower electrode layer, said piezoelectric structure including at least one conductive layer and multiple piezoelectric layers sandwiching said conductive layer, said conductive layer having a same crystal structure as that of said piezoelectric layers; and
    forming an upper electrode layer formed on said piezoelectric structure.

9. The method as set forth in claim 8, wherein said crystal structure is perovskite.

10. The method as set forth in claim 9, wherein each of said piezoelectric layers comprises one of lead zirconate titanate (PZT), lead niobate titanate zirconate (PNZT), lead lanthane titanate zirconate (PLZT), lead lanthane titanate (PLT), lead magneciumate niobate (PMN) and lead manganate niobate (PMNN).

11. The method as set forth in claim 9, wherein said conductive layer comprises one of strontium ruthenium oxide $SrRuO_3$ (SRO), lanthan nickel oxide $LaNiO_3$ (LNO) and barium ruthenium oxide $BaRuO_3$ (BRO).

12. The method as set forth in claim 11, wherein said conductive layer is less than 100 nm, preferably, about 50 nm.

13. The method as set forth in claim 8, wherein forming of said piezoelectric structure comprises:
   forming said piezoelectric layers in an ion plating apparatus; and
   forming said conductive layer in a sputtering apparatus, wherein said ion plating apparatus and said sputtering apparatus are linked by a carrier vacuum chamber.

* * * * *